United States Patent
Estes et al.

(10) Patent No.: US 6,570,362 B1
(45) Date of Patent: May 27, 2003

(54) PORTABLE ELECTRONIC DEVICE WITH ENHANCED BATTERY LIFE AND COOLING

(75) Inventors: Kurt Estes, Lake Zurich, IL (US); Debabrata Pal, Hoffman Estates, IL (US); Kevin McDunn, Lake in the Hills, IL (US); Irina Shmagin, Streamwood, IL (US); Daniel Gamota, Palatine, IL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/643,535

(22) Filed: Aug. 22, 2000

(51) Int. Cl.$^7$ .............................. H02J 7/00; H01L 35/30
(52) U.S. Cl. ..................... 320/101; 320/150; 136/205
(58) Field of Search ................................ 320/101, 150; 136/200, 205

(56) References Cited

U.S. PATENT DOCUMENTS

| | | | |
|---|---|---|---|
| 4,213,292 A | * | 7/1980 | Dolezal et al. ............. 368/204 |
| 4,320,477 A | * | 3/1982 | Baumgartner ................. 368/64 |
| 4,377,198 A | | 3/1983 | Welling et al. |
| 5,083,605 A | | 1/1992 | Collings |
| 5,455,458 A | | 10/1995 | Quon et al. |
| 5,705,770 A | * | 1/1998 | Ogasawara et al. ......... 136/205 |
| 6,172,486 B1 | * | 1/2001 | Campagnuolo et al. ..... 320/141 |

* cited by examiner

*Primary Examiner*—Gregory J. Toatley, Jr.
(74) *Attorney, Agent, or Firm*—Sylvia Chen; Roland K. Bowler, II

(57) ABSTRACT

Battery life and cooling are improved in an electronic device. A thermoelectric module and phase change material module are placed near a heat source in an electronic device. The thermoelectric module and phase change material module insulate a surface to be cooled on the electronic device. The thermoelectric module generates an electrical current in response to a temperature differential at opposite surfaces on the thermoelectric module. The phase change material module enhances or limits the temperature differential seen at the thermoelectric module. The electrical current generated by the thermoelectric module is used to charge a battery of the electronic device.

19 Claims, 3 Drawing Sheets

PORTABLE ELECTRONIC DEVICE WITH ENHANCED BATTERY LIFE AND COOLING

FIELD OF THE INVENTION

The present invention relates generally to portable electronic devices, and in particular, to portable electronic devices with rechargeable batteries.

BACKGROUND OF THE INVENTION

Portable electronic devices are presently a staple item in today's society. These electronic devices include audio entertainment equipment, computers, personal digital assistants, wireless telephones and many other devices. Due to the portable nature of these devices, batteries are employed to provide power to the electronic components. Of course, since batteries have a finite time before recharge, enhancing the life of the battery associated with a portable electronic device is extremely important. In particular, battery life is important for complex communications devices such as wireless phones.

There are many proposed solutions for enhancing the battery life of portable electronic devices. Traditionally, these solutions seek to reduce the amount of power consumed by the electronic device. In some cases, power consumption is reduced in accordance with the function of the device. For example, some circuitry of an electronic device is shut down during a "standby" mode, while certain functions are not required. In other cases, the electronic components are designed in a manner to reduce power consumption, for example, by using CMOS technology and other low power technologies. Unfortunately, these techniques alone do not eliminate the need for additional low power solutions to enhance battery life. Indeed, functionality requirements are increasing as fast as low power consumption techniques are developed.

Portable electronic devices dissipate heat. As the functionality and hence the electronic circuitry of portable devices increases, the amount of heat dissipated tends to increase. Heat dissipation in a portable electronic device often causes user discomfort. For example, some wireless telephones dissipate enough heat to cause discomfort to a user's ear while using the phone. This is obviously not desirable for the user. In addition, the heat dissipation, in particular, in a small electronic device, may cause the desirable operating temperature of the device to be exceeded.

Therefore a need exists for a portable electronic device with enhanced battery life and improved cooling requirements.

DETAILED DESCRIPTION OF THE PREFERRED EMBODIMENTS

In summary, an electronic device in accordance with the present invention includes a cooling device. The cooling device is coupled to an existing heat source within the electronic device, such as a printed circuit board with electronic components dissipating heat. The cooling device includes a thermoelectric module and a phase change material module.

In a preferred embodiment, one surface of the thermoelectric module is placed near an external surface of the housing of the device and an opposite side of the thermoelectric module is placed adjacent to the phase change material module. The phase change material module is placed near the heat source. The thermoelectric module converts heat into electricity as a function of the temperature differential between the two surfaces of the thermoelectric module. The phase change material stores heat to limit the temperature of the electronic device at a point slightly above the melting temperature of the phase change material. Also, the phase change material maintains a temperature differential across the thermoelectric module when the heat source is generating heat and for a period of time after the heat source cools.

In an alternate preferred embodiment, one surface of the thermoelectric module is placed near the heat source and an opposite side of the thermoelectric module is placed near the phase change material. The phase change material is placed near the external surface of the electronic device. As described above, the thermoelectric module converts heat into electricity as a function of a temperature differential between the surfaces of the thermoelectric module. The phase change material absorbs heat to limit the temperature of the surface of the electronic device, on the one hand, and enhances the temperature differential across the thermoelectric module, on the other hand.

Preferably, the thermoelectric module is coupled to a battery in the electronic device such that an electronic current generated by the thermoelectric module is used to charge the battery. A diode is coupled between the battery and the thermoelectric module to prevent discharging of the battery when the thermoelectric module is not providing a charging current. Alternatively, a rectifier is coupled between the thermoelectric module and the battery to take advantage of a positive or a negative temperature differential to charge the battery both when the electronic device is in operation and not in operation.

Figure 1:
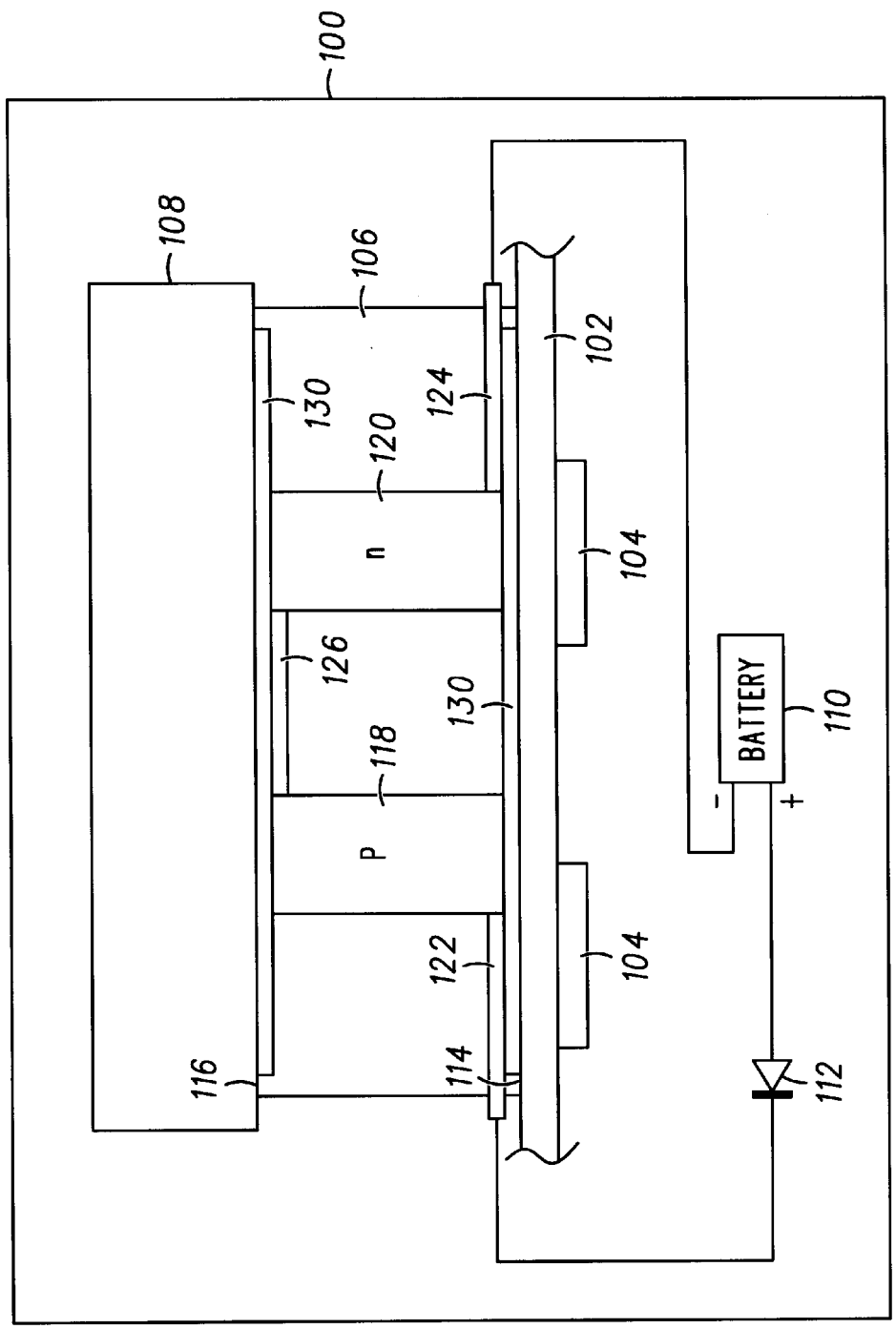
FIG. 1 is a schematic diagram showing a side elevation view of a preferred embodiment of an electronic device with enhanced battery life and cooling.

FIG. 1 is a schematic diagram showing an electronic device 100 with enhanced battery life and cooling. Preferably, the electronic device 100 is a wireless telephone, pager, personal digital assistant, computer or another portable electronic device.

The electronic device 100 includes a printed circuit board (PCB) 102, a side view of which is partially shown in FIG. 1. The printed circuit board 102 includes electronic components 104, which implement the functions of the electronic device 100 in a manner well known to those of skill in the art. Electronic components 104 dissipate heat during normal operation. Therefore, the printed circuit board 102 and electronic components 104 provide a natural heat source within the electronic device 100, as a result of normal operation of electronic device 100.

A thermoelectric module 106 is mounted adjacent to the printed circuit board 102. The thermoelectric module 106 is also mounted adjacent to a phase change material (PCM) module 108. The thermoelectric module 106 converts heat to electricity. In particular, a temperature differential between a first surface 114 and an opposite second surface 116 causes current flow between hot and cold junctions of P-type material 118 and N-type material 120 contained within a housing of the thermoelectric module 106. A P-type electrode 122 is coupled to the P-type material 118 and provides an external connection for the thermoelectric module 106. An N-type electrode 124 is coupled to the N-type material 120 and provides an external connection to the thermoelectric module 106.

The PCM module 108 is a container of phase change material. The PCM material absorbs heat almost isothermally over a period of time. Hence, the PCM module 108 tends to maintain the temperature on the second surface 116 of the thermoelectric module 106 almost isothermal during the operation of the electronic device 100.

A rechargeable battery 110 is provided for the electronic device 100 for powering the electronic components 104 in the electronic device 100. The battery 110 is coupled to the thermoelectric module 106 to receive the electricity generated by the thermoelectric module 106. In particular, the N-type electrode 124 is coupled to a negative terminal of the battery 110 and the P-type electrode 122 is coupled through a diode 112 to the positive terminal of the battery 110. A diode 112 prevents reverse current drain from the battery 110. The battery 110 may be part of a battery charging, conditioning and maintenance system, the details of which are excluded for simplicity of explanation. Where a battery charging system is employed, the charging current from the thermoelectric module 106 is sourced into the battery charging system for use in recharging battery the 110 in a manner well known to those of skill in the art.

In operation, the printed circuit board 102 and components 104 provide a heat source during normal operation of the electronic device 100. This heat source is concentrated at a first surface 114 of the thermoelectric module 106. The PCM module 108 is adjacent to the second surface 116 of the thermoelectric module 106. The PCM module 108 helps maintain the second surface 116 of the thermoelectric module 106 at a temperature cooler than the temperature of the first surface 114 of the thermoelectric module 106. Due to the difference in temperature of the first surface 114 and the second surface 116, an electric current is generated between the P-type material 118 and the N-type material 120 and conducted via an electrode 126, which is situated between the P-type material 118 and N-type material 120. Electrodes 122 and 124, which are coupled to the P-type material and N-type material, respectively, are operably coupled to a battery 110 to charge the battery 110 during a period of time when the electronic device 100 is operating. In addition to maintaining the temperature at the surface 116, the PCM module 108 helps maintain cooling on an external surface of the electronic device 100.

The PCM module 108 preferably has a housing formed from sheet metal or other flexible metallic material. Preferably, solid/liquid PCM and a thermal enhancement, such as honeycomb or foam, are formed within the housing of the PCM module 108. Preferably, the thermoelectric module 106 is attached to the PCM module 108 by ultrasonic welding or crimping, which allows attachment at lower temperatures.

A preferred phase change material is Indalloy 136, which has a composition of 49 Bi (bismuth), 21 In (indium), 18 Pb (lead), and 12 Sn (tin). The thermophysical properties of Indalloy 136 are given below in Table 1. The time to melt for Indalloy 136 is given below in Table 2 for certain PCM thicknesses. The preferred PCM material is alternatively an organic paraffin.

TABLE 1

Thermophysical Properties

| | |
|---|---|
| $T_m$ (deg-C) | 58 |
| K(W/m-K) | 10 |
| Density | 9001 |
| Specific heat, solid (J/kg-K) | 323 |
| Specific heat, liquid (J/kg-K) | 721 |
| Average specific heat (J/kg-K) | 522 |
| Latent heat of melting (J/kg) | 28900 |
| Thermal diffusivity | 2.12833E-06 |

TABLE 2

| PCM thickness(m) | Time to melt (minutes)* |
|---|---|
| 3.00E-03 | 8.391238056 |
| 5.00E-03 | 13.98539676 |
| 6.25E-03 | 17.48174595 |
| 1.00E-02 | 27.97079352 |

*Assumes no heat loss and perfect thermal connection

The preferred phase change material is chosen such that its melting point is as high a temperature as the device being cooled can tolerate. Generally, the phase change material melting point is below the maximum operating temperature of the device.

A preferred thermoelectric module is available from Melcor, of Trenton, N.J. The preferred thermoelectric module consists of multiple p-n $Bi_2Te_3$ thermocouples. Each thermocouple has one P-type and one N-type element. The elements are in the shape of elongated ingots with a square cross-section, vertically mounted between two heat conductive alumina plates 130, as shown schematically in FIG. 1. The alumina plates 130 serve as heat sinks and also provide mechanical integrity to the device. Electrode patterns are preferably defined on the inside surface of both alumina plates to connect the thermocouples in series to maximize the voltage output by the thermoelectric module. A preferred thermoelectric module from Melcor consists of 254 thermocouples that are 0.2 centimeters long and 0.1 centimeters wide. The preferred thermoelectric module is 3 centimeters wide, 6 centimeters long and 0.4 centimeters tall. Any suitable thermoelectric module can alternatively be used.

Preferably the thermoelectric module 106 is attached to the heat source, for example, by adhesive, soldering or a compressive interface with a compliant interface pad in combination with threaded fasteners to provide clamping pressure. Preferably the thermoelectric module 106 is coupled near the hottest heat source in the electronic device 100. For example, in the case where the electronic device 100 is a wireless telephone, the thermoelectric module should be placed adjacent to the exciter or power amplifier in the wireless telephone.

Figure 2:
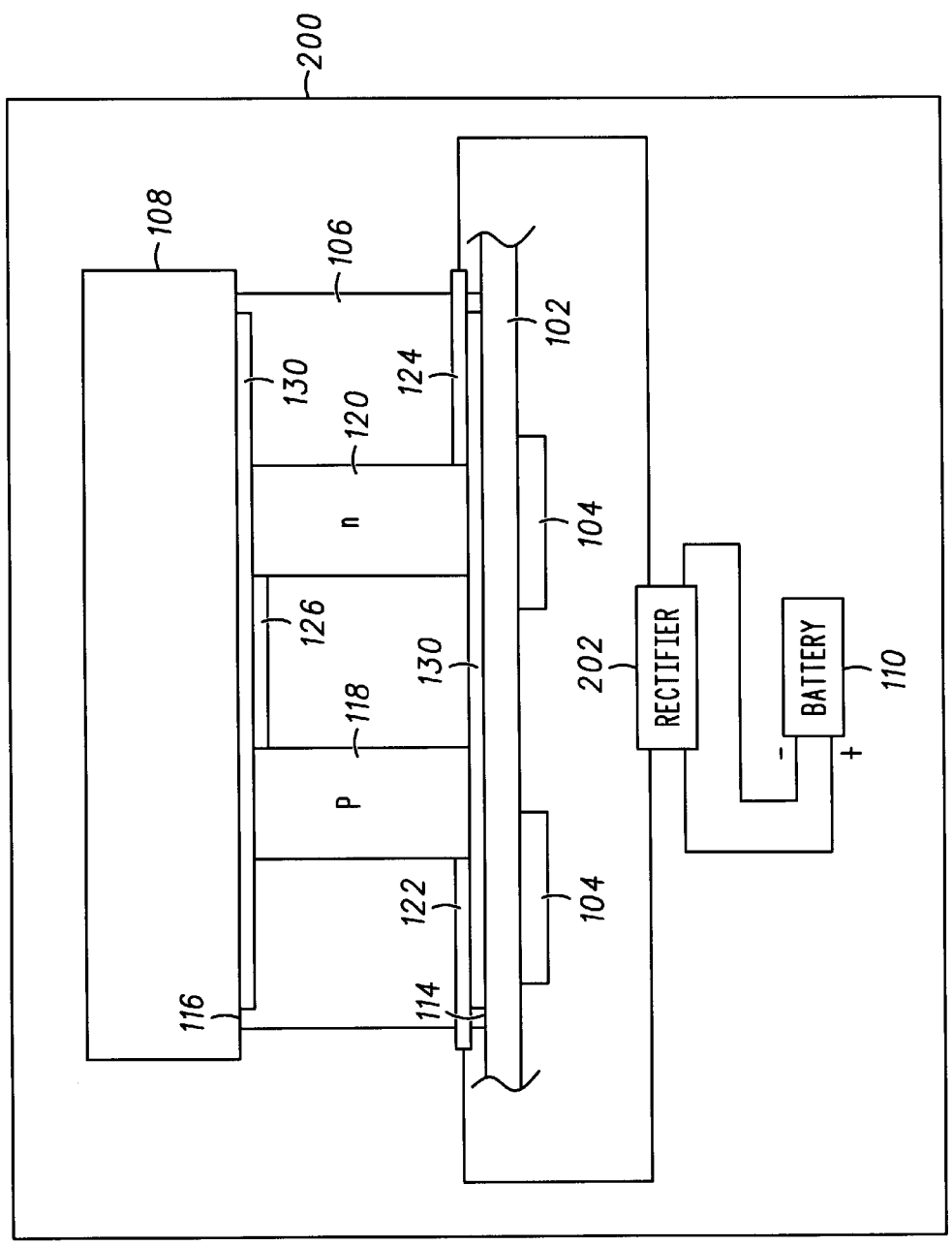
FIG. 2 is a schematic diagram showing a side elevation view of an alternate preferred embodiment an electronic device with enhanced battery life and cooling.

FIG. 2 shows an alternate preferred embodiment of an electronic device 200 with enhanced battery life and cooling. The electronic device 200 incorporates the PCM module 108 and thermoelectric module 106 as described above with respect to FIG. 1. The electronic device 200 also includes a rectifier 202 that rectifies a positive or negative current from the thermoelectric module 106 for use in charging a battery 110. Any suitable rectifier, for example, a full wave rectifier, suffices. Alternatives to the rectifier 202 include an arrangement of diodes and switches, where the switches alternatively permit current to flow based on whether the device is on. In operation, the electronic device 200 provides a charging current to the battery 110 via the thermoelectric module 106 due to a differential in temperature between the heat source (PCB 102 and components 104) and a surface adjacent to the PCM module 108. This is similar to the charging provided by the electronic device 100. This electronic device 200 advantageously also provides a charging current to the battery 110 due to a differential temperature nominally occurring when the electronic device 200 is off. More specifically, if the first surface 114 of the thermoelectric module 106 is made cooler than the second surface 116 of the thermoelectric module 106, then an electronic current is generated of a polarity opposite to the current generated when the temperature gradient is in the opposite direction. The rectifier uses this current of opposite polarity to charge the battery 110 after the electric current is rectified by the rectifier 202.

Figure 3:
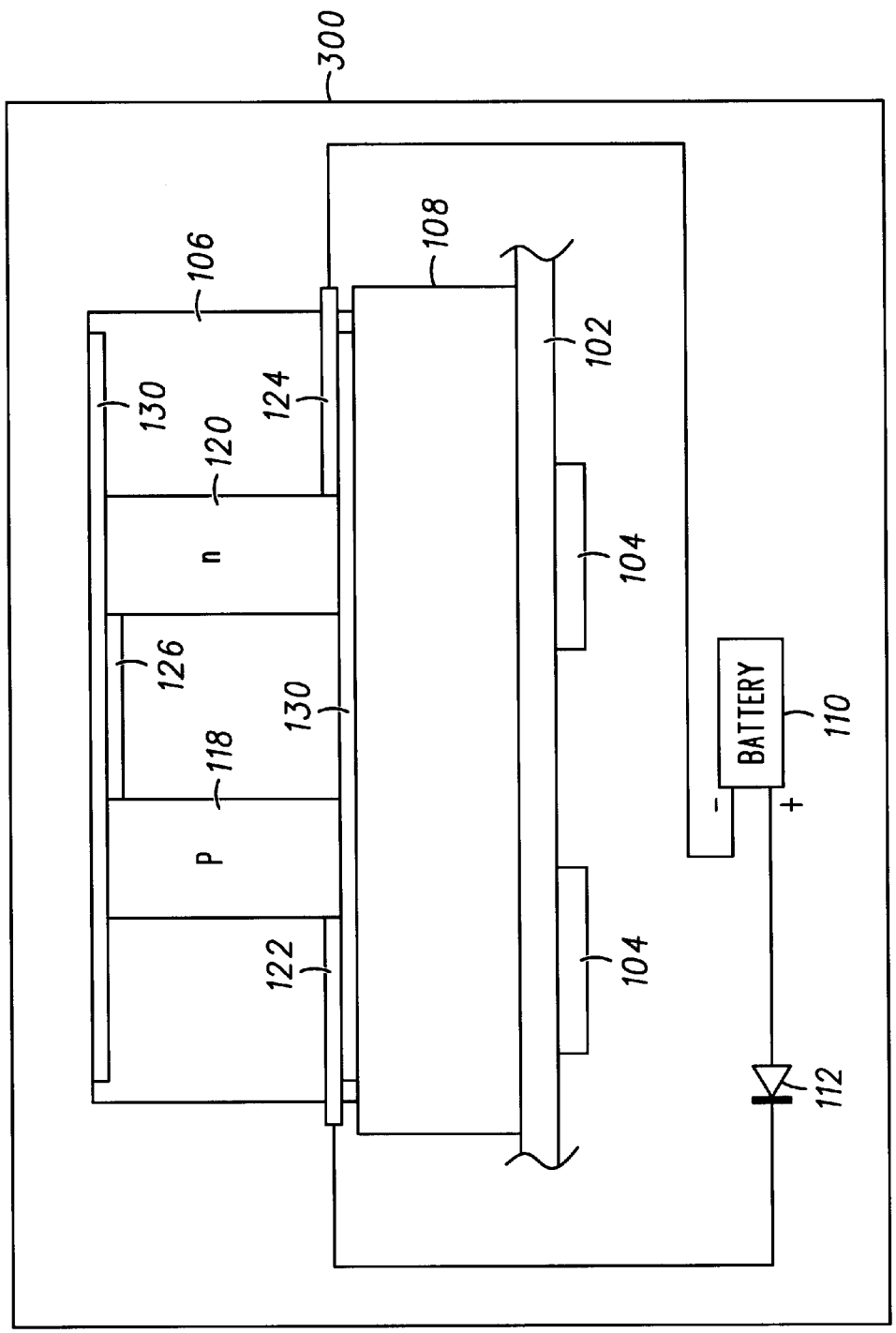
FIG. 3 is a schematic diagram showing a side elevation view of another alternate preferred embodiment of an electronic device with enhanced battery life and cooling.

FIG. 3 shows another alternate preferred embodiment of an electronic device 300 with enhanced battery life and cooling. The electronic device 300 is similar to the electronic device 100 and includes a printed circuit board 102 with electronic components 104, PCM module 108 and thermoelectric module 106. The spatial relationship, however, between the heat source, PCM module 108 and the thermoelectric module 106 is different than previously described. In particular, the PCM module 108 is placed adjacent to the heat source, that is, the PCB 102 and electronic components 104. The thermoelectric module 106 has one surface adjacent to the PCM module 108 and an opposite surface near an external surface of the electronic device 300. The thermoelectric module 106 is coupled to a diode 112 and a rechargeable battery 110 in a configuration analogous to the configuration shown in FIG. 1.

The printed circuit board 102 and components 104 provide a heat source during normal operation of the electronic device 300. This heat source is concentrated at a surface of the PCM module 108 closest to the PCB 102. The PCM module 108 absorbs and stores heat from the heat source such that the side of the PCM module 108 opposite the heat source is maintained at a temperature slightly less than the melting point of the PCM module material. This temperature is about the temperature of the surface of the thermoelectric module 106 that is adjacent to the PCM module 108. The opposite surface of the thermoelectric module 106 is close to an external surface of the electronic device 300, which external surface is exposed to ambient temperature. Therefore, the temperature differential between the opposite surfaces of the thermoelectric module 106 causes a charging current to be generated by the thermoelectric module 106. Advantageously, when the electronic device 300 is shut off, the PCM module 108 maintains its temperature for some period time, in spite of cooling of the heat source. As a result, a temperature differential between the opposite surfaces of the thermoelectric module 106, and hence, a charging current is maintained for a period of time after the electronic device 300 is shut off. Notably, the charging current is of the same polarity during both operation and shut off.

The present invention advantageously charges a battery during operation of an electronic device and even during some idle periods. This substantially enhances the life of the battery. The battery charger is energized by heat dissipated in the electronic device. In spite of the heat dissipated in the electronic device, a surface of the device is cooled by conduction through a thermoelectric module and phase change material. The human user interface remains cool to the touch via the considerable thermal capacity of the phase change material module and the series of thermal resistance between the heat source and the human user interface.

The invention being thus described, it will be evident that the same may be varied in many ways. Such variations are not to be regarded as a departure from the spirit and scope of the invention and all such modifications are intended to be included within the scope of the claims.

We claim:

1. An electronic device comprising:
   an electronic circuit;
   a thermoelectric module, positioned proximate the electronic circuit; and
   a phase change material coupled to the thermoelectric module.

2. The electronic device of claim 1 further comprising:
   a battery coupled to the thermoelectric module.

3. The electronic device of claim 1 further comprising:
   a rectifier coupled to the thermoelectric module; and
   a battery coupled to the rectifier.

4. The electronic device of claim 1 further comprising:
   a diode coupled to the thermoelectric module; and
   a battery coupled to the diode.

5. The electronic device of claim 1 further comprising:
   a heat source, for heating one surface of the thermoelectric module during normal operation of the electronic device.

6. The electronic device of claim 5 wherein the heat source comprises:
   a printed circuit board and at least one electronic component.

7. The electronic device of claim 1 wherein the phase change material has a housing formed from a flexible metallic material.

8. The electronic device of claim 1 wherein the phase change material has a melting point that is below a maximum operating temperature of the electronic device.

9. The electronic device of claim 1 wherein the thermoelectric module comprises at least one $Bi_2Te_3$ thermocouple in a shape of an elongated ingot with a parallelogram cross-section.

10. The electronic device of claim 1 further comprising:
    a device housing, for containing the electronic circuit, the thermoelectric module, and the phase change material.

11. The electronic device of claim 10 wherein the phase change material is closer to an external surface of the device housing than the thermoelectric module.

12. The electronic device of claim 11 wherein the thermoelectric module is attached to the electronic circuit.

13. The electronic device of claim 12 wherein the phase change material is attached to the thermoelectric module.

14. The electronic device of claim 10 wherein the thermoelectric module is closer to an external surface of the device housing than the phase change material.

15. The electronic device of claim 14 wherein the phase change material is attached to the electronic circuit.

16. The electronic device of claim 15 wherein the thermoelectric module is attached to the phase change material.

17. A method for recharging a battery in a electronic device, the method comprising the steps of:
    operating the electronic device to produce heat;
    converting heat from the electronic device into electricity;
    deploying a phase change material within the electronic device to control an amount of heat that is converted into electricity; and
    using the electricity to charge the battery.

18. The method of claim 17 wherein a thermoelectric module is used in the step of converting heat from the electronic device into electricity.

19. The method of claim 18 further comprising the step of converting heat to electricity even after the electronic device is turned off.

* * * * *